United States Patent
Sun et al.

(10) Patent No.: US 8,895,862 B2
(45) Date of Patent: Nov. 25, 2014

(54) SUBSTRATE STRUCTURE

(75) Inventors: Sheng-Yuan Sun, Tainan (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 253 days.

(21) Appl. No.: 13/572,705

(22) Filed: Aug. 13, 2012

(65) Prior Publication Data
US 2013/0277093 A1 Oct. 24, 2013

(30) Foreign Application Priority Data

Apr. 24, 2012 (TW) .............................. 101114569 A

(51) Int. Cl.
*H05K 1/00* (2006.01)
(52) U.S. Cl.
USPC ........... 174/252; 174/250; 174/251; 174/253; 174/256; 257/88
(58) Field of Classification Search
None
See application file for complete search history.

(56) References Cited

U.S. PATENT DOCUMENTS

| | | | |
|---|---|---|---|
| 2005/0073840 A1* | 4/2005 | Chou et al. | 362/238 |
| 2007/0023893 A1* | 2/2007 | Shin et al. | 257/713 |
| 2008/0123334 A1* | 5/2008 | Hochstein | 362/249 |
| 2008/0291688 A1* | 11/2008 | Higashi | 362/516 |
| 2010/0032692 A1* | 2/2010 | Lee et al. | 257/88 |
| 2010/0277919 A1* | 11/2010 | Okada et al. | 362/249.02 |
| 2011/0291124 A1* | 12/2011 | DeSamber et al. | 257/88 |

* cited by examiner

*Primary Examiner* — Tuan T Dinh
*Assistant Examiner* — Steven T Sawyer
(74) *Attorney, Agent, or Firm* — Jianq Chyun IP Office

(57) ABSTRACT

A substrate structure for carrying plural heat generating elements is provided. The substrate structure includes a board, a patterned metal layer and plural heat dissipating channels. The board has an upper surface. The patterned metal layer is disposed on the board and includes a first electrode, a second electrode, plural first pads and plural second pads. The first pads and the second pads are alternatively disposed on the upper surface in parallel. Parts of the first (second) pads are electrically connected to the first (second) electrode. The other parts of first pads and the other parts of second pads are electrically connected to each other. Each first pad and the adjacent second pad define a device bonding area. The heat generating elements are respectively disposed in the device bonding areas. There are multiple trenches between the two adjacent device bonding areas. The heat dissipating channels are disposed in the trenches.

14 Claims, 6 Drawing Sheets

SUBSTRATE STRUCTURE

CROSS-REFERENCE TO RELATED APPLICATION

This application claims the priority benefit of Taiwan application serial no. 101114569, filed on Apr. 24, 2012. The entirety of the above-mentioned patent application is hereby incorporated by reference herein and made a part of this specification.

BACKGROUND OF THE INVENTION

1. Field of the Invention

The invention relates to a substrate structure. Particularly, the invention relates to a substrate structure having a heat dissipating effect.

2. Description of Related Art

Light-emitting diodes (LEDs) have been widely used as indicators or light sources in home appliances and various equipments due to its advantages of long service life, small size, high shock resistance, low heat generation and low power consumption, etc. In recent years, the LEDs are developed to have a high power, and application domains thereof have been extended to road lighting, large outdoor billboards, traffic lights, and related fields. In the future, the LED may even become a main illumination light source having both of a power saving function and an environmental protection function.

Generally, when a high power LED chip emits light with a high brightness, a large amount of heat is generated. If the heat energy cannot be dissipated and is continuously accumulated within the LED chip, a temperature of the LED chip is continuously increased. In this way, the brightness and the service life of the LED chip are probably decreased due to overheat, which may even cause a permanent damage. Moreover, in a high density and multi-chip package structure, since the LED chips are arranged in an array, the heat generated by the LED chips at a central area of the whole array is hard to be dissipated compared to the heat generated at a peripheral area of the whole array. Namely, the heat generated by the LEDs is gathered at a central position of the multi-chip package structure. In this way, the service life of the LED chips at the central area is liable to be shorter than the service life of the LED chips at the peripheral area, which may influence reliability of the whole multi-chip package structure.

SUMMARY OF THE INVENTION

The invention is directed to a substrate structure, which has a better heat dissipating effect.

The invention provides a substrate structure, which is adapted to carry a plurality of heat generating elements. The substrate structure includes a board, a patterned metal layer and a plurality of heat dissipating channels. The board has an upper surface. The patterned metal layer is disposed on the board and includes a first electrode, a second electrode, a plurality of first pads and a plurality of second pads. The first electrode does not contact the second electrode. The first pads and the second pads are alternately disposed on the upper surface in parallel. Parts of the first pads are electrically connected to the first electrode. Parts of the second pads are electrically connected to the second electrode. The other parts of the first pads and the other parts of second pads are electrically connected to each other, respectively. Each of the first pads and the adjacent second pad define a device bonding area. The heat generating elements are respectively disposed in the device bonding areas. There is a plurality of trenches between the adjacent two device bonding areas. The heat dissipating channels are disposed in the trenches.

In an embodiment of the invention, the first electrode and the second electrode are located on the upper surface of the board, and the first pads and the second pads are located between the first electrode and the second electrode.

In an embodiment of the invention, the patterned metal layer further includes a plurality of first connection lines and a plurality of second connection lines disposed on the upper surface of the board. The parts of the first pads are electrically connected to the first electrode through the first connection lines, and the parts of the second pads are electrically connected to the second electrode through the second connection lines.

In an embodiment of the invention, the board further has a lower surface opposite to the upper surface, and the first electrode and the second electrode are disposed on the lower surface.

In an embodiment of the invention, the substrate structure further includes a plurality of first conductive channels and a plurality of second conductive channels. The first conductive channels and the second conductive channels penetrate through the board. The parts of the first pads are electrically connected to the first electrode through the first conductive channels, and the parts of the second pads are electrically connected to the second electrode through the second conductive channels.

In an embodiment of the invention, the patterned metal layer further includes a plurality of bridge lines disposed on the upper surface of the board. The other parts of the first pads are electrically connected to the other parts of the second pads through the bridge lines, respectively.

In an embodiment of the invention, at least one of the heat dissipating channels is connected to the first electrode or the second electrode.

In an embodiment of the invention, the heat dissipating channels are disposed on the upper surface of the board.

In an embodiment of the invention, the heat dissipating channels are embedded in the upper surface of the board.

In an embodiment of the invention, the heat dissipating channels penetrate through the board, and a top surface of each of the heat dissipating channels is aligned to the upper surface of the board, and a bottom surface of each of the heat dissipating channels is aligned to a lower surface of the board opposite to the upper surface.

In an embodiment of the invention, the heat dissipating channels include a plurality of first heat dissipating channels extended along a first axial line and a plurality of second heat dissipating channels extended along a second axial line. The first axial line is perpendicular to the second axial line, and the first heat dissipating channels are partially overlapped or non-overlapped to the second heat dissipating channels.

In an embodiment of the invention, an edge shape of each of the first heat dissipating channels and an edge shape of each of the second heat dissipating channels present a continuous straight-line shape, a wave shape or a zigzag shape.

In an embodiment of the invention, the heat dissipating channels are composed of a plurality of non-continuous block patterns.

In an embodiment of the invention, each of the heat generating elements is a light-emitting diode (LED) chip. Each of the LED chips has a first conductive contact and a second conductive contact. The first conductive contact and the second conductive contact are electrically connected to the first pad and the second pad of the corresponding device bonding area, respectively.

According to the above descriptions, since the heat dissipating channels of the invention are disposed in the trenches between adjacent two device bonding areas, besides that the heat generate by the heat generating elements is conducted to the lower patterned metal layer through heat conduction and can have a convection to the external environment by the patterned metal layer, the heat generated by the adjacent two heat generating elements can also be conducted to the heat dissipating channels through heat convection, so as to dissipate the heat generated by the heat generating elements through conduction and convection. Therefore, the substrate structure of the invention may have better heat dissipating efficiency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
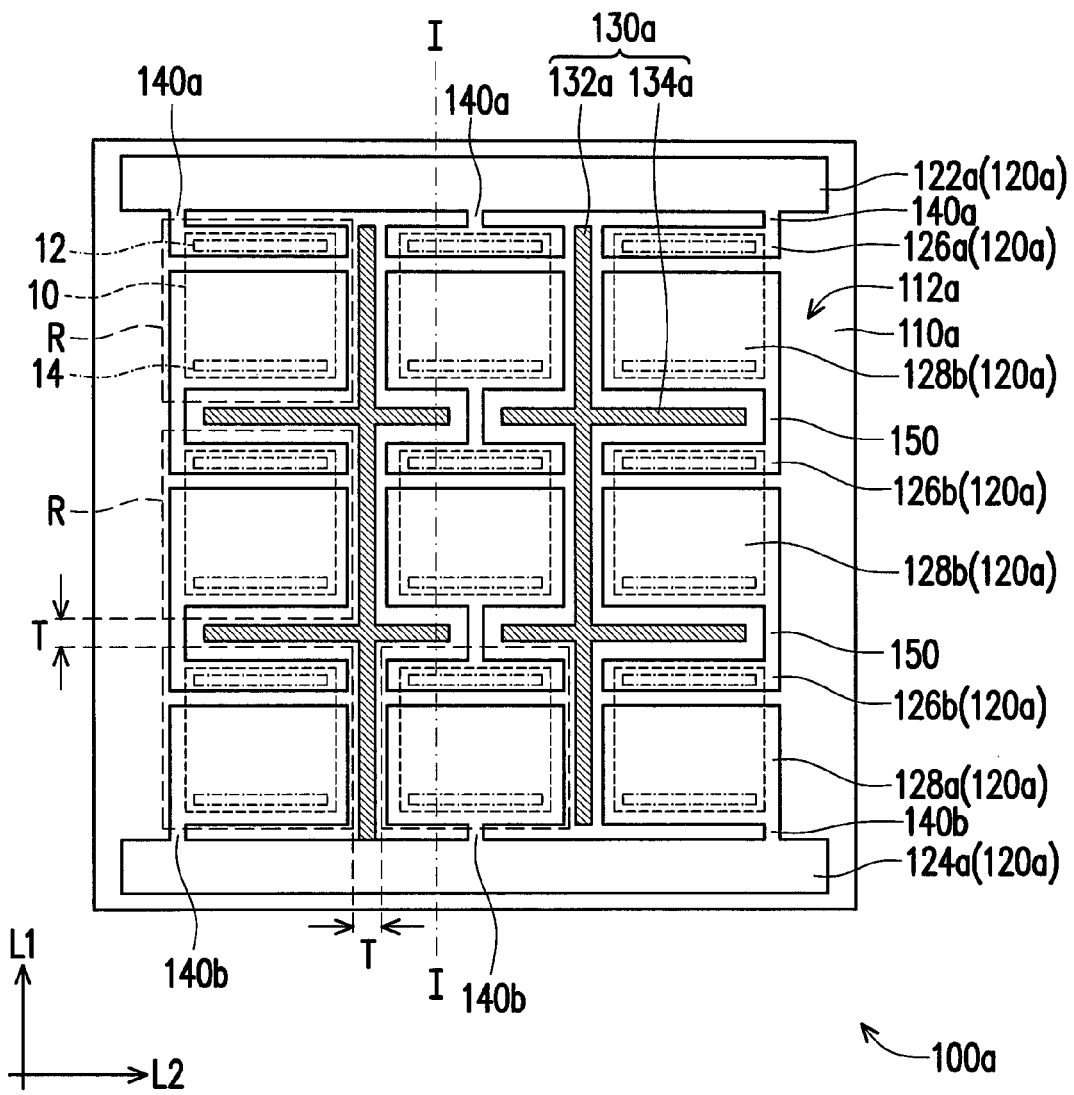
FIG. 1A is a top view of a substrate structure according to an embodiment of the invention.
Figure 1B:
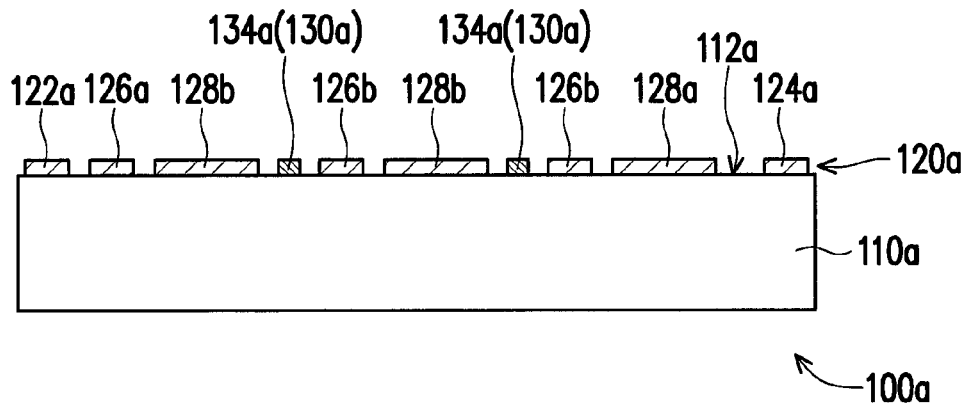
FIG. 1B is a cross-sectional view of the substrate structure of FIG. 1A viewed along a line I-I according to an embodiment of the invention.

FIG. 1A is a top view of a substrate structure according to an embodiment of the invention. FIG. 1B is a cross-sectional view of the substrate structure of FIG. 1A viewed along a line I-I. For simplicity's sake, heat generating elements disposed on the substrate structure of FIG. 1A are omitted in FIG. 1B. Referring to FIG. 1A and FIG. 1B, in the present embodiment, the substrate structure 100a is adapted to carry a plurality of heat generating elements 10, and the substrate structure 100a includes a board 110a, a patterned metal layer 120a and a plurality of heat dissipating channels 130a. In the present embodiment, each of the heat generating elements 10 is a light-emitting diode (LED) chip, and each of the LED chips 10 has a first conductive contact 12 and a second conductive contact 14.

In detail, the board 110a has an upper surface 112a. The patterned metal layer 120a is disposed on the board 110a and includes a first electrode 122a, a second electrode 124a, a plurality of first pads 126a and 126b, and a plurality of second pads 128a and 128b. The first electrode 122a does not contact the second electrode 124a, and the first electrode 122a and the second electrode 124a are respectively located at two sides on the upper surface 112a of the board 110a. The first pads 126a and 126b and the second pads 128a and 128b are alternately disposed on the upper surface 112a in parallel, and the first pads 126a and 126b and the second pads 128a and 128b are located between the first electrode 122a and the second electrode 124a. The first pads 126a are electrically connected to the first electrode 122a. The second pads 128a are electrically connected to the second electrode 124a. The first pads 126b are electrically connected to the second pads 128b, respectively.

In detail, the patterned metal layer 120a of the present embodiment further includes a plurality of first connection lines 140a, a plurality of second connection lines 140b and a plurality of bridge lines 150. The first connection lines 140a, the second connection lines 140b and the bridge lines 150 are disposed on the upper surface 112a of the board 110a. The first pads 126a are electrically connected to the first electrode 122a through the first connection lines 140a, and the second pads 128a are electrically connected to the second electrode 124a through the second connection lines 140b. The first pads 126b are electrically connected to the second pads 128b through the bridge lines 150.

In the present embodiment, each of the first pads 126a or 126b and the adjacent second pad 128a or 128b define a device bonding area R, and there is a plurality of trenches T between the two adjacent device bonding areas R. Moreover, the heat generating elements 10 are respectively disposed in the device bonding areas R, and the first conductive contacts 12 and the second conductive contacts 14 of the heat generating elements 10 are electrically connected to the first pads 126a and 126b and the second pads 128a and 128b in the corresponding device bonding area R, respectively. Particularly, the heat dissipating channels 130a of the present embodiment are disposed in the trenches T, and the heat dissipating channels 130a are located on the upper surface 112a of the board 110a.

In detail, referring to FIG. 1A, the heat dissipating channels 130a include a plurality of first heat dissipating channels 132a extended along a first axial line L1 and a plurality of second heat dissipating channels 134a extended along a second axial line L2, where at least one of the first heat dissipating channels 132a is connected to the second electrode 124a. Certainly, in other embodiments that are not illustrated, at least one of the first heat dissipating channels 132a can be connected to the first electrode 122a. The first axial line L1 is perpendicular to the second axial line L2, and the first heat dissipating channels 132a are partially overlapped to the second heat dissipating channels 134a. Namely, the first heat dissipating channels 132a are perpendicular and partially overlapped to the second heat dissipating channels 134a. An edge shape of each of the first heat dissipating channels 132a and an edge shape of each of the second heat dissipating channels 134a present a continuous straight-line shape.

Figure 1C:
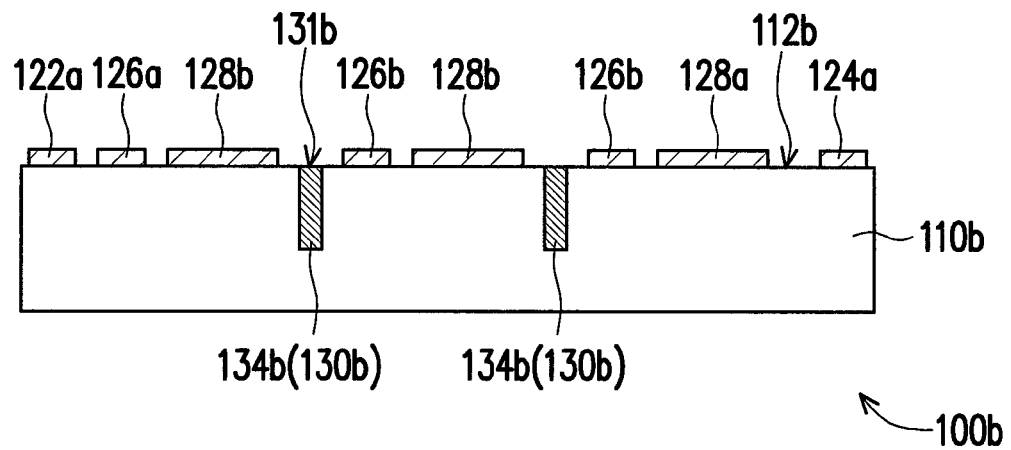
FIG. 1C is a cross-sectional view of the substrate structure of FIG. 1A viewed along a line I-I according to anther embodiment of the invention.
Figure 1D:
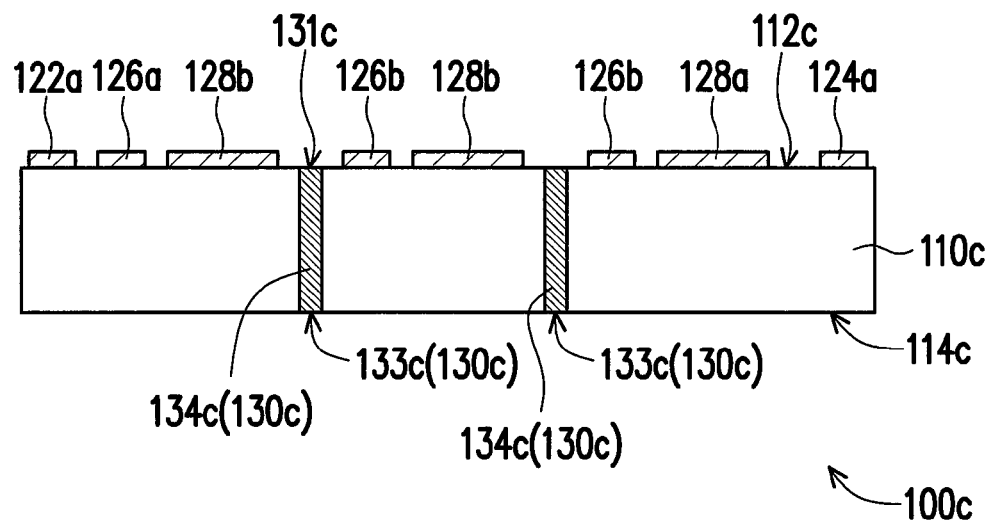
FIG. 1D is a cross-sectional view of the substrate structure of FIG. 1A viewed along a line I-I according to still another embodiment of the invention.

It should be noticed that although the heat dissipating channels 130a are located on the supper surface 112a of the board 110a, the configuration method of the heat dissipating channels 130a is not limited thereto, and in other embodiments, referring to FIG. 1C, heat dissipating channels 130b (for example, the second heat dissipating channels 134b) of a substrate structure 100b are embedded in an upper surface 112b of a board 110b, and a top surface 131b of each of the heat dissipating channels 130b is aligned to the upper surface 112b of the board 110b. Alternatively, referring to FIG. 1D, heat dissipating channels 130c (for example, the second heat dissipating channels 134c) of a heat dissipating substrate 100c penetrate through a board 110c, and a top surface 131c of each of the heat dissipating channels 130c is aligned to an upper surface 112c of the board 110c, and a bottom surface 133c of each of the heat dissipating channels 130c is aligned to a lower surface 114c of the board 110c opposite to the upper surface 112c. Therefore, the configuration method of the heat dissipating channels 130a of FIG. 1B is only an example, which is not used to limit the invention.

Since the heat dissipating channels 130a of the present embodiment are disposed in the trenches T between adjacent two device bonding areas R, besides that the heat generated by the heat generating elements 10 is conducted to the lower patterned metal layer 120a through heat conduction and can have a convection to the external environment by the patterned metal layer 120a, the heat generated by the adjacent two heat generating elements 10 can also be conducted to the heat dissipating channels 130a through heat convection, so as to dissipate the heat generated by the heat generating elements 10 through conduction and convection. In other words, by configuring the heat dissipating channels 130a, the heat generating elements 10 at a central area of the board 110a and the heat generating elements 10 at a peripheral area may have similar heat dissipating effects. In this way, the substrate structure 100a of the present embodiment may effectively dissipate the heat generated by the heat generating elements 10 to external, so as to achieve a better heat dissipating efficiency.

Structure designs of heat dissipating channels 130d, 130e and 130f are described in following embodiments. It should be noticed that the device referential numbers and a part of the contents of the aforementioned embodiment are adopted in the following embodiments, where the same reference numbers are used to refer to the same or like parts, and descriptions of the same technical contents are omitted. The aforementioned embodiment can be referred for descriptions of the omitted parts, which are not repeated in the following embodiments.

Figure 2:
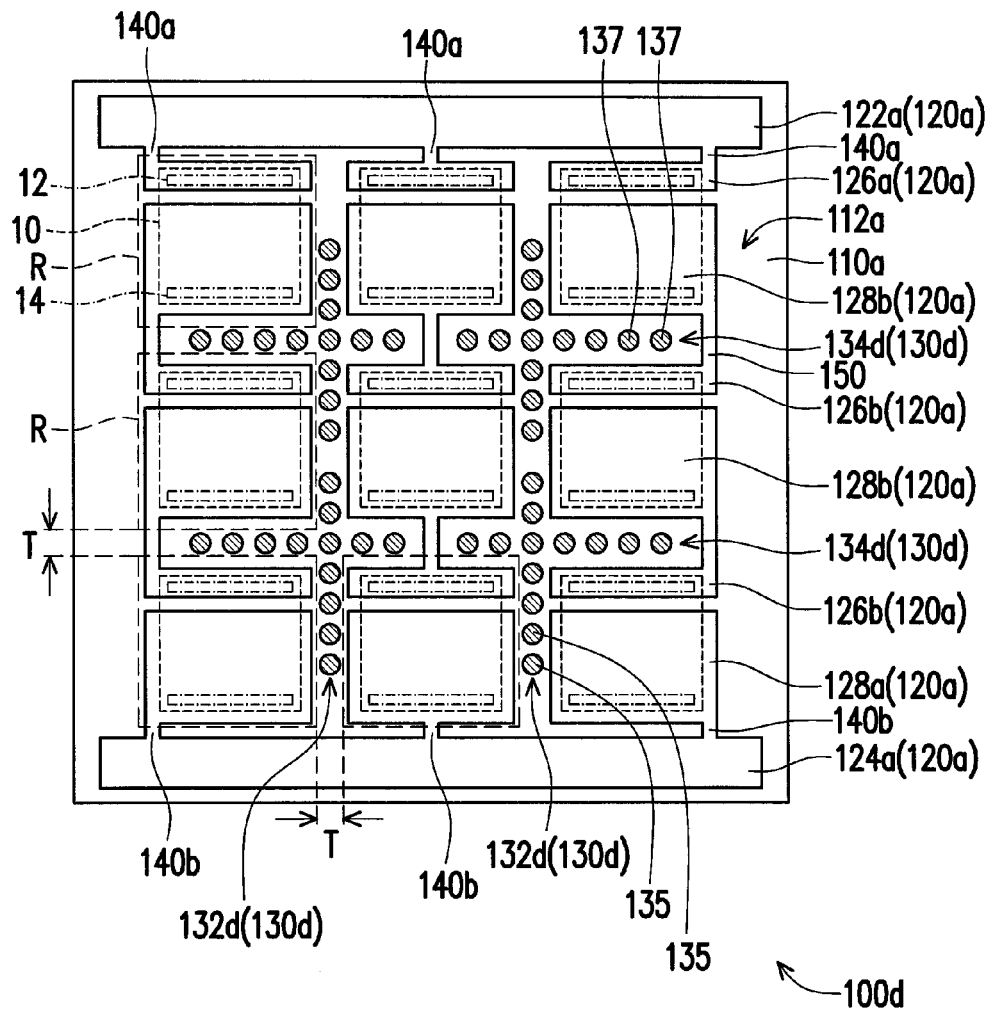
FIG. 2 is a top view of a substrate structure according to another embodiment of the invention.

FIG. 2 is a top view of a substrate structure according to another embodiment of the invention. Referring to FIG. 2, the substrate structure 100d of the present embodiment is similar to the substrate structure 100a of FIG. 1A, and a difference there between is that a first heat dissipating channel 132d of the heat dissipating channel 130d of the substrate structure 100d of FIG. 2 is composed of a plurality of non-continuous block patterns 135, and a second heat dissipating channel 134d of the heat dissipating channel 130d is composed of a plurality of non-continuous block patterns 137. In the present embodiment, a shape of each of the block patterns 135 and 137 is, for example, a round, though in other embodiments, the shape of each of the block patterns 135 and 137 can also be a rectangle, a triangle or other suitable polygons. Moreover, the first heat dissipating channels 132d of the heat dissipating channel 130d of the present embodiment are not connected to the first electrode 122a or the second electrode 124a.

Figure 3:
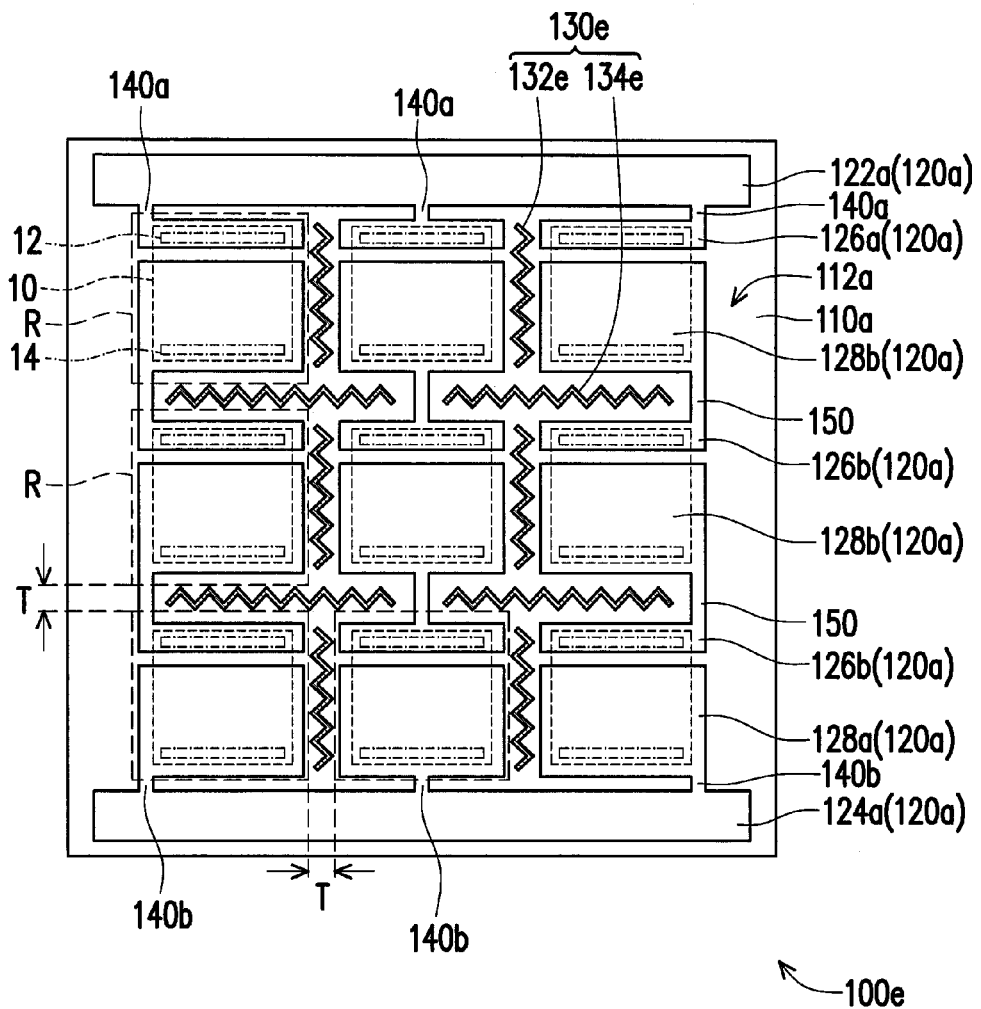
FIG. 3 is a top view of a substrate structure according to still another embodiment of the invention.

FIG. 3 is a top view of a substrate structure according to still another embodiment of the invention. Referring to FIG. 3, the substrate structure 100e of the present embodiment is similar to the substrate structure 100a of FIG. 1A, and a difference there between is that an edge shape of each of the first heat dissipating channels 132e and an edge shape of each of the second heat dissipating channels 134e of the heat dissipating channels 130e of the substrate structure 100e of FIG. 3 present a continuous zigzag shape, and the first heat dissipating channels 132e are not overlapped to the second heat dissipating channels 134e. Moreover, the first heat dissipating channels 132e of the heat dissipating channel 130e of the present embodiment are not connected to the first electrode 122a or the second electrode 124a.

Figure 4:
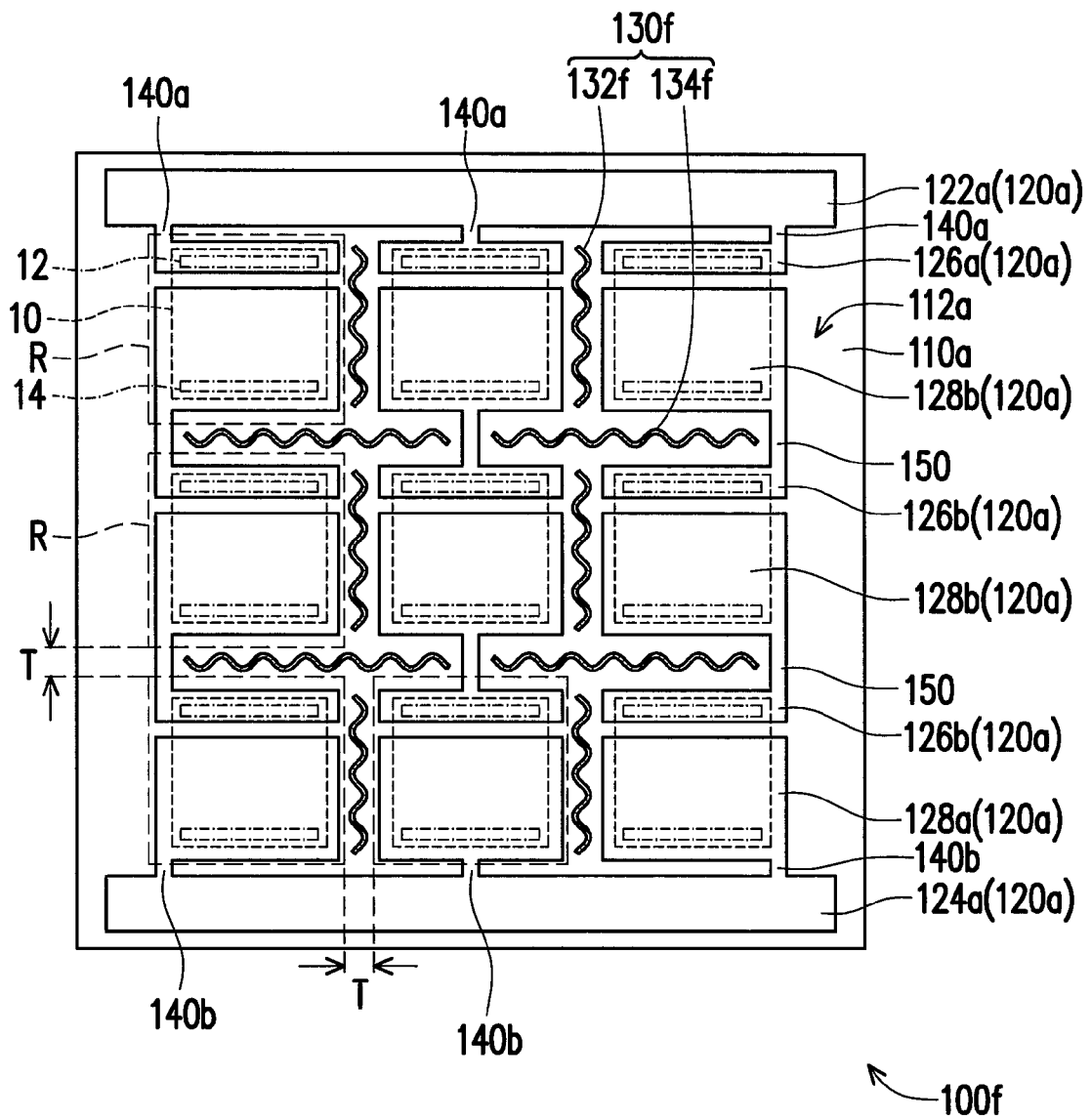
FIG. 4 is a top view of a substrate structure according to yet another embodiment of the invention.

FIG. 4 is a top view of a substrate structure according to yet another embodiment of the invention. Referring to FIG. 4, the substrate structure 100f of the present embodiment is similar to the substrate structure 100a of FIG. 1A, and a difference there between is that an edge shape of each of the first heat dissipating channels 132f and an edge shape of each of the second heat dissipating channels 134f of the heat dissipating channels 130f of the substrate structure 100f of FIG. 4 present a continuous wave shape, and the first heat dissipating channels 132f are not overlapped to the second heat dissipating channels 134f. Moreover, the first heat dissipating channels 132f of the heat dissipating channel 130f of the present embodiment are not connected to the first electrode 122a or the second electrode 124a.

Figure 5A:
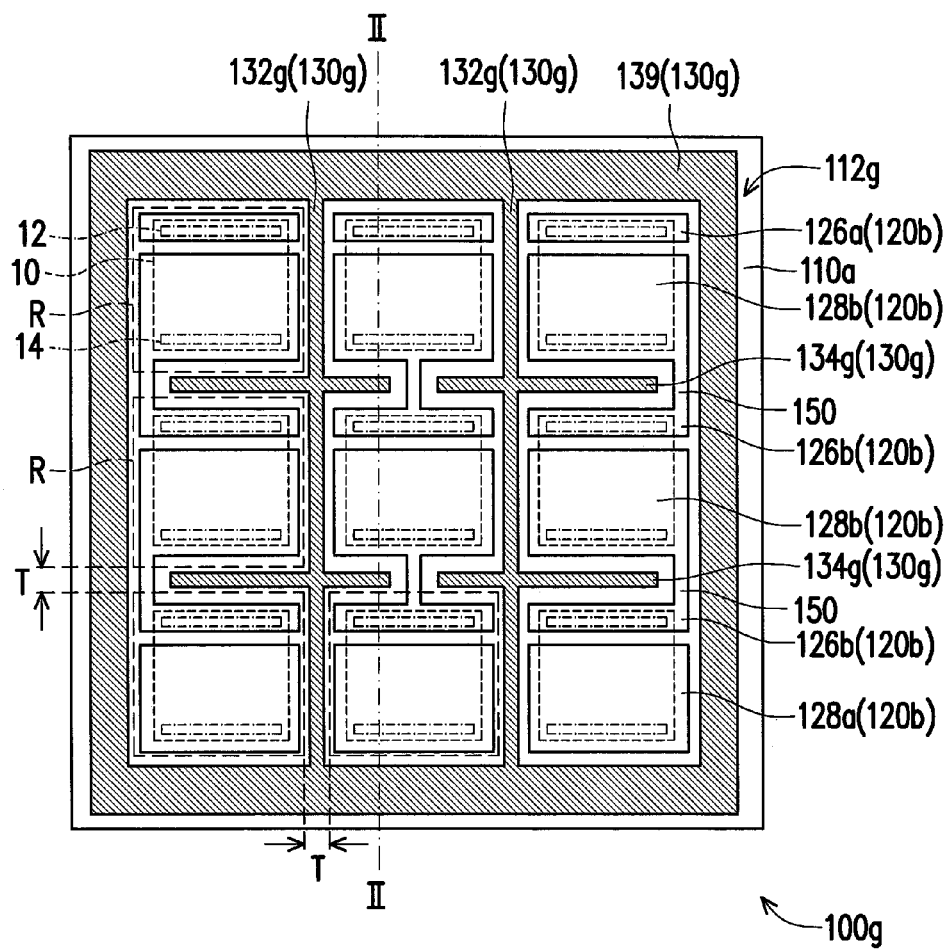
FIG. 5A is a top view of a substrate structure according to still another embodiment of the invention.
Figure 5B:
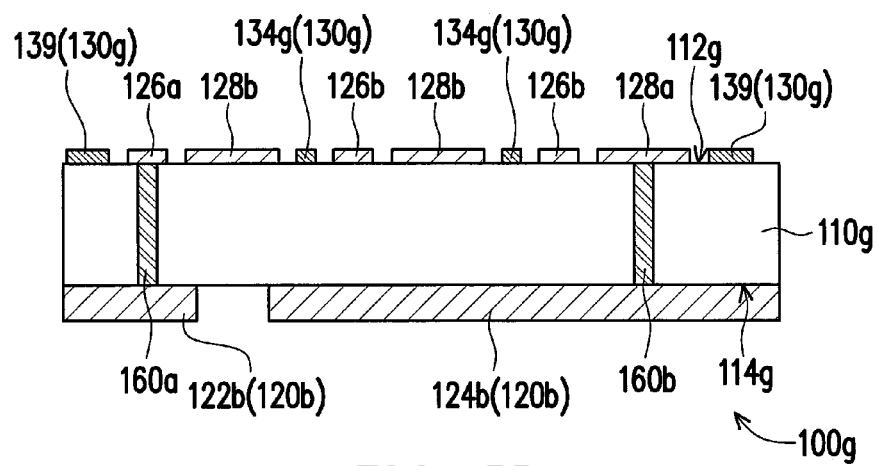
FIG. 5B is a cross-sectional view of the substrate structure of FIG. 5A viewed along a line II-II.

FIG. 5A is a top view of a substrate structure according to still another embodiment of the invention. FIG. 5B is a cross-sectional view of the substrate structure of FIG. 5A viewed along a line II-II. For simplicity's sake, the heat generating elements disposed on the substrate structure of FIG. 5A are omitted in FIG. 5B. Referring to FIG. 5A and FIG. 5B, in the present embodiment, the substrate structure 100g is similar to the substrate structure 100a of FIG. 1A, though a difference there between is that a first electrode 122b and a second electrode 124b of a patterned metal layer 120b of the substrate structure 100g are located on a lower surface 114g of a board 110g, and the substrate structure 110g further includes a plurality of first conductive channels 160a (only one is schematically illustrated in FIG. 5B) and a plurality of second conductive channels 160b (only one is schematically illustrated in FIG. 5B).

In detail, the first conductive channels 160a and the second conductive channels 160b penetrate through the board 110g. The first pads 126a are electrically connected to the first electrode 122b through the first conductive channels 160a. The second pads 128a are electrically connected to the first electrode 124b through the second conductive channels 160b. Moreover, the heat dissipating channels 130g of the present embodiment further include a heat dissipating ring 139 surrounding the device bonding areas R. The heat dissipating ring 139 further can be connected to the first heat dissipating channels 132g. In this way, the heat generated by the adjacent two heat generating elements 10 can be conducted to the heat dissipating channel 130g through heat convection, and is further conducted to the heat dissipating ring 139 with a larger area through heat conduction, so as to effectively dissipating the heat generated by the adjacent two heat generating elements 10 to external.

In summary, since the heat dissipating channels of the invention are disposed in the trenches between adjacent two device bonding areas, besides that the heat generate by the heat generating elements is conducted to the lower patterned metal layer through heat conduction and can have a convection to the external environment by the patterned metal layer, the heat generated by the adjacent two heat generating elements can also be conducted to the heat dissipating channels through heat convection, so as to dissipate the heat generated by the heat generating elements through conduction and convection. In other words, by configuring the heat dissipating channels, the heat generating elements at a central area of the board and the heat generating elements at a peripheral area of the board may have similar heat dissipating effects. In this way, the substrate structure of the invention may effectively dissipate the heat generated by the heat generating elements to external, so as to achieve a better heat dissipating efficiency.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A substrate structure that carries a plurality of heat generating elements, the substrate structure comprising: a board, having an upper surface; a patterned metal layer, disposed on the board, and comprising a first electrode, a second electrode, a plurality of first pads and a plurality of second pads, wherein the first electrode does not contact the second electrode, the first pads and the second pads are alternately disposed on the upper surface in parallel, parts of the first pads are electrically connected to the first electrode, and parts of the second pads are electrically connected to the second electrode, the other parts of the first pads and the other parts of second pads are electrically connected to each other, respectively, each of the first pads and the adjacent second pad define a device bonding area, the heat generating elements are respectively disposed in the device bonding areas, and there is a plurality of trenches between the adjacent two device bonding areas; and a plurality of heat dissipating channels, disposed in the trenches; wherein the heat dissipating channels comprise a plurality of first heat dissipating channels extended along a first axial line and a plurality of second heat dissipating channels extended along a second axial line, the first axial line is perpendicular to the second axial line, and the first heat dissipating channels are partially overlapped or non-overlapped to the second heat dissipating channels.

2. The substrate structure as claimed in claim 1, wherein the first electrode and the second electrode are located on the upper surface of the board, and the first pads and the second pads are located between the first electrode and the second electrode.

3. The substrate structure as claimed in claim 1, wherein the board further has a lower surface opposite to the upper surface, and the first electrode and the second electrode are disposed on the lower surface.

4. The substrate structure as claimed in claim 1, wherein the patterned metal layer further comprises a plurality of bridge lines disposed on the upper surface of the board, the other parts of the first pads are electrically connected to the other parts of the second pads through the bridge lines, respectively.

5. The substrate structure as claimed in claim 1, wherein at least one of the heat dissipating channels is connected to the first electrode or the second electrode.

6. The substrate structure as claimed in claim 1, wherein the heat dissipating channels are disposed on the upper surface of the board.

7. The substrate structure as claimed in claim 1, wherein the heat dissipating channels are embedded in the upper surface of the board.

8. The substrate structure as claimed in claim 1, wherein the heat dissipating channels penetrate through the board, and a top surface of each of the heat dissipating channels is aligned to the upper surface of the board, and a bottom surface of each of the heat dissipating channels is aligned to a lower surface of the board opposite to the upper surface.

9. The substrate structure as claimed in claim 1, wherein an edge shape of each of the heat dissipating channels present a continuous straight-line shape, a wave shape or a zigzag shape.

10. The substrate structure as claimed in claim 1, wherein the heat dissipating channels are composed of a plurality of non-continuous block patterns.

11. The substrate structure as claimed in claim 1, wherein each of the heat generating elements is a light-emitting diode chip, each of the light-emitting diode chips has a first conductive contact and a second conductive contact, the first conductive contact and the second conductive contact are electrically connected to the first pad and the second pad of the corresponding device bonding area, respectively.

12. The substrate structure as claimed in claim 2, wherein the patterned metal layer further comprises a plurality of first connection lines and a plurality of second connection lines disposed on the upper surface of the board, the parts of the first pads are electrically connected to the first electrode through the first connection lines, and the parts of the second pads are electrically connected to the second electrode through the second connection lines.

13. The substrate structure as claimed in claim 3, further comprising a plurality of first conductive channels and a plurality of second conductive channels, wherein the first conductive channels and the second conductive channels penetrate through the board, the parts of the first pads are electrically connected to the first electrode through the first conductive channels, and the parts of the second pads are electrically connected to the second electrode through the second conductive channels.

14. The substrate structure as claimed in claim 13, further comprising a heat dissipating ring surrounding the device bonding areas.

* * * * *